US 11,659,746 B2

(12) United States Patent
Saitoh et al.

(10) Patent No.: US 11,659,746 B2
(45) Date of Patent: May 23, 2023

(54) DISPLAY DEVICE

(71) Applicant: SHARP KABUSHIKI KAISHA, Sakai (JP)

(72) Inventors: Takao Saitoh, Sakai (JP); Seiji Kaneko, Sakai (JP); Yohsuke Kanzaki, Sakai (JP); Masahiko Miwa, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 472 days.

(21) Appl. No.: 16/979,453

(22) PCT Filed: Mar. 9, 2018

(86) PCT No.: PCT/JP2018/009235
§ 371 (c)(1),
(2) Date: Sep. 9, 2020

(87) PCT Pub. No.: WO2019/171581
PCT Pub. Date: Sep. 12, 2019

(65) Prior Publication Data
US 2021/0005702 A1    Jan. 7, 2021

(51) Int. Cl.
*H10K 59/131*    (2023.01)
*H10K 59/124*    (2023.01)
(Continued)

(52) U.S. Cl.
CPC .......... *H10K 59/131* (2023.02); *H10K 59/124* (2023.02); *H10K 77/111* (2023.02); *H10K 2102/311* (2023.02)

(58) Field of Classification Search
CPC .... H10K 59/10; H10K 59/124; H10K 59/179; H10K 77/111; H10K 2102/311; H10K 50/8426; H01L 27/3276; H01L 27/3258; H01L 51/5253; H01L 51/5256; H01L 51/5246; H01L 51/0097; H01L 51/50; H01L 2251/5338
See application file for complete search history.

(56) References Cited

U.S. PATENT DOCUMENTS 9,291,843 B2 *  3/2016  Yeo .................... G02F 1/133305
10,111,301 B2 * 10/2018  Ka ......................... G06F 1/1652
(Continued)

FOREIGN PATENT DOCUMENTS

CN   107819008 A  *  3/2018  ........... G09G 3/3266
JP   2014-232300 A     12/2014
KR   20170115213 A *  10/2017  ......... H01L 51/5253

*Primary Examiner* — Errol V Fernandes
*Assistant Examiner* — Jeremy J Joy
(74) *Attorney, Agent, or Firm* — ScienBiziP, P.C.

(57) ABSTRACT

A first wiring line and a second wiring line are extended to an upper face of a resin substrate exposed from a slit formed in at least one layer of an inorganic insulating film, a first flattening film is provided within the slit which exposes the upper face of the resin substrate between the portions to which the first wiring line and the second wiring line are extended, and the first wiring line and the second wiring line are electrically connected to each other via a third wiring line provided between an end face of the first flattening film and the upper face of the resin substrate.

13 Claims, 8 Drawing Sheets

(51) Int. Cl.
  *H10K 77/10* (2023.01)
  *H10K 102/00* (2023.01)

(56) References Cited

U.S. PATENT DOCUMENTS

| | | | | |
|---|---|---|---|---|
| 10,181,576 | B2 * | 1/2019 | Chung | H01L 51/5253 |
| 10,229,632 | B2 * | 3/2019 | Chung | G09G 3/3208 |
| 10,256,165 | B2 * | 4/2019 | Chung | G09G 3/3685 |
| 10,297,771 | B2 * | 5/2019 | Choi | H01L 27/3262 |
| 10,325,972 | B2 * | 6/2019 | Park | H01L 27/3262 |
| 2010/0065832 | A1 * | 3/2010 | Sugimoto | H10K 50/85 |
| | | | | 257/40 |
| 2011/0050657 | A1 * | 3/2011 | Yamada | H10K 59/18 |
| | | | | 361/679.01 |
| 2013/0002583 | A1 * | 1/2013 | Jin | G06F 3/041 |
| | | | | 313/511 |
| 2014/0002385 | A1 * | 1/2014 | Ka | H05B 33/04 |
| | | | | 345/173 |
| 2014/0353670 | A1 | 12/2014 | Youn et al. | |
| 2015/0109544 | A1 * | 4/2015 | Yeo | G02F 1/133305 |
| | | | | 349/12 |
| 2015/0137098 | A1 * | 5/2015 | Tanaka | H10K 59/131 |
| | | | | 438/23 |
| 2015/0138041 | A1 * | 5/2015 | Hirakata | H10K 59/131 |
| | | | | 345/1.3 |
| 2015/0287750 | A1 | 10/2015 | Youn et al. | |
| 2017/0125505 | A1 * | 5/2017 | Oh | H10K 59/1213 |
| 2017/0229527 | A1 * | 8/2017 | Baek | H10K 59/12 |
| 2017/0277288 | A1 * | 9/2017 | Choi | H10K 50/844 |
| 2017/0338294 | A1 * | 11/2017 | Choi | H10K 77/111 |
| 2018/0062094 | A1 * | 3/2018 | Kwon | H10K 50/844 |
| 2018/0068613 | A1 * | 3/2018 | Chung | G06F 3/147 |
| 2018/0074361 | A1 * | 3/2018 | Chung | H05K 5/02 |
| 2018/0076415 | A1 * | 3/2018 | Chung | H10K 59/131 |
| 2018/0151662 | A1 * | 5/2018 | Rhe | H10K 77/111 |
| 2018/0342707 | A1 * | 11/2018 | Lee | H10K 77/111 |
| 2019/0326383 | A1 * | 10/2019 | Yamanaka | H10K 59/124 |
| 2019/0347989 | A1 * | 11/2019 | Lee | H10K 59/131 |
| 2019/0355800 | A1 * | 11/2019 | Saitoh | H05B 33/22 |
| 2019/0363152 | A1 * | 11/2019 | Kanzaki | G09F 9/30 |
| 2020/0066821 | A1 * | 2/2020 | Saitoh | H05B 33/22 |
| 2020/0152910 | A1 * | 5/2020 | Okabe | H10K 59/124 |

* cited by examiner

DISPLAY DEVICE

TECHNICAL FIELD

The disclosure relates to a display device.

BACKGROUND ART

In recent years, organic electroluminescence (EL) display devices, which use organic electroluminescence (EL) elements and are of the self-luminous type, have attracted attention as a display device that can replace the liquid crystal display device. As this type of organic EL display device, a flexible organic EL display device is proposed in which an organic EL element or the like is formed on a resin substrate having flexibility. In the organic EL display device, there are provided a rectangular display region for displaying an image and a frame region formed around the display region, where the frame region is required to be reduced in size. In the organic EL display device having flexibility, when the frame region is reduced by bending the frame region, there is a risk that a wiring line disposed in the frame region is broken.

For example, PTL 1 discloses a flexible display device that forms a bending hole, thus removing a part of each of a buffer film, a gate insulating film, and an interlayer insulating film each corresponding to the bending region, and thus preventing disconnection of the wiring line.

CITATION LIST

Patent Literature

PTL 1: JP2014-232300A

SUMMARY

Technical Problem

Incidentally, since a flexible organic EL display device is provided with an inorganic insulating film such as a base coat film, a gate insulating film, and an interlayer insulating film on a resin substrate, the inorganic insulating film in a bending portion of a frame region is removed in some case to suppress breakage of the inorganic insulating film in the bending portion in order to suppress disconnection of wiring lines disposed in the frame region. For example, in an organic EL display device having a rectangular display region and provided with first and second bending portions in a frame region along two adjacent sides of the display region respectively, it is possible to suppress, by removing an inorganic insulating film in the first and second bending portions, the breakage of the inorganic insulating film in the first and second bending portions. However, in the organic EL display device having such configuration, although the disconnection of first and second wiring lines provided in the first and second bending portions respectively may be suppressed, there is room for improvement because the electrical connection between the first wiring line and the second wiring line is not considered, for example.

The disclosure has been conceived in view of the above issue, and an object thereof is to electrically connect a first wiring line provided in a first bending portion and a second wiring line provided in a second bending portion with ease.

Solution to Problem

To accomplish the object described above, a display device according to the disclosure is a display device that includes: a resin substrate; a thin film transistor (TFT) layer provided on the resin substrate; a light-emitting element provided on the TFT layer and constituting a display region; a frame region with at least three sides provided around the display region; a terminal portion provided at an end portion of one side of the frame region with at least three sides; a first bending portion provided to extend in one direction between the display region and the terminal portion; a second bending portion provided to extend in one direction at another side of the frame region adjacent to the one side of the frame region having the first bending portion; at least one layer of an inorganic insulating film provided in the frame region with at least three sides and constituting the TFT layer layered on the resin substrate; a first flattening film provided on the at least one layer of the inorganic insulating film; a first wiring line provided on the first flattening film at the one side of the frame region; a second wiring line provided on the first flattening film at the other side of the frame region; and a second flattening film provided to cover the first wiring line and the second wiring line. In the stated display device, in the first bending portion and the second bending portion, a slit is formed in the at least one layer of the inorganic insulating film, where the slit passes through the at least one layer of the inorganic insulating film to expose an upper face of the resin substrate; the first wiring line and the second wiring line are extended to the upper face of the resin substrate exposed from the slit; the first flattening film is provided at an interior of the slit; the first flattening film is provided at the interior of the slit which exposes the upper face of the resin substrate between portions to which the first wiring line and the second wiring line are extended; and the first wiring line and the second wiring line are electrically connected to each other via a third wiring line that is provided between an end face of the first flattening film and the upper face of the resin substrate, and is formed with a material identical to the material of the first wiring line and the second wiring line in a layer identical to the layer of the first wiring line and the second wiring line.

Advantageous Effects of Disclosure

According to the disclosure, the first wiring line and the second wiring line are electrically connected to each other via the third wiring line that is provided between the end face of the first flattening film and the upper face of the resin substrate, and is formed with the material identical to that of the first wiring line and the second wiring line in the layer identical to that of the first wiring line and the second wiring line, whereby the first wiring line provided in the first bending portion and the second wiring line provided in the second bending portion may be electrically connected with ease.

DESCRIPTION OF EMBODIMENTS

Embodiments of the disclosure will be described below in detail with reference to the drawings. The disclosure is not limited to the embodiments described below.

First Embodiment

Figure 1:
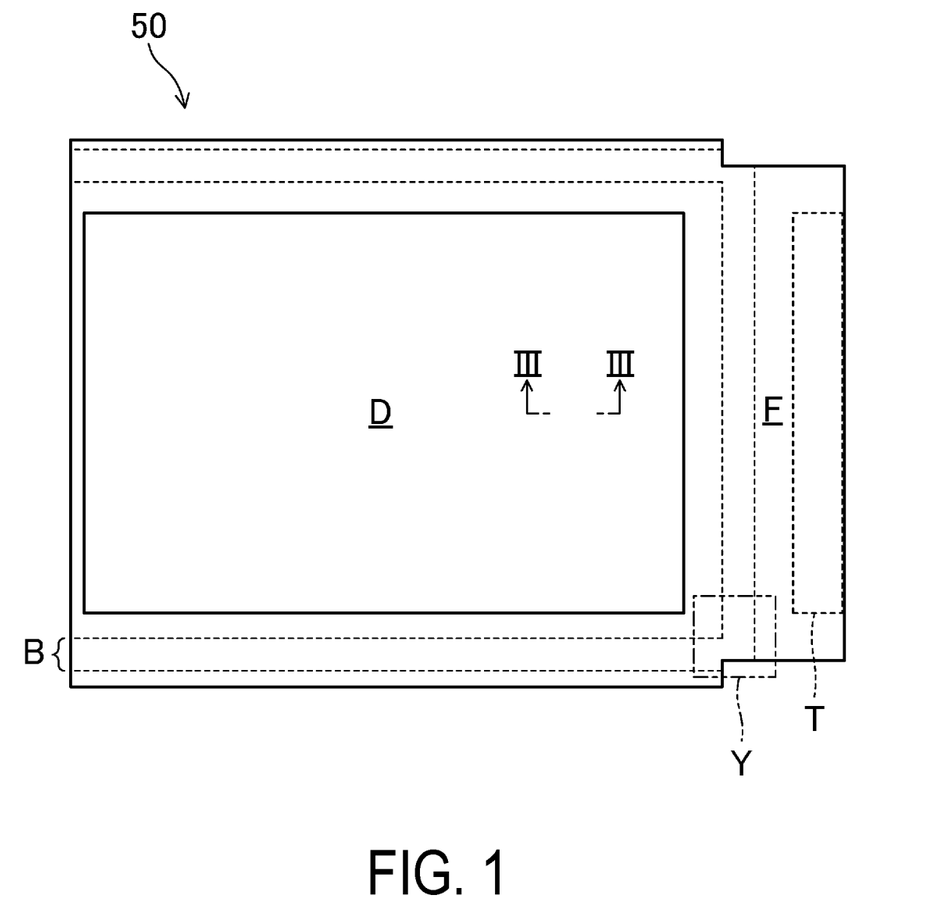
FIG. 1 is a plan view illustrating an overall configuration of an organic EL display device according to a first embodiment of the disclosure.
Figure 2:
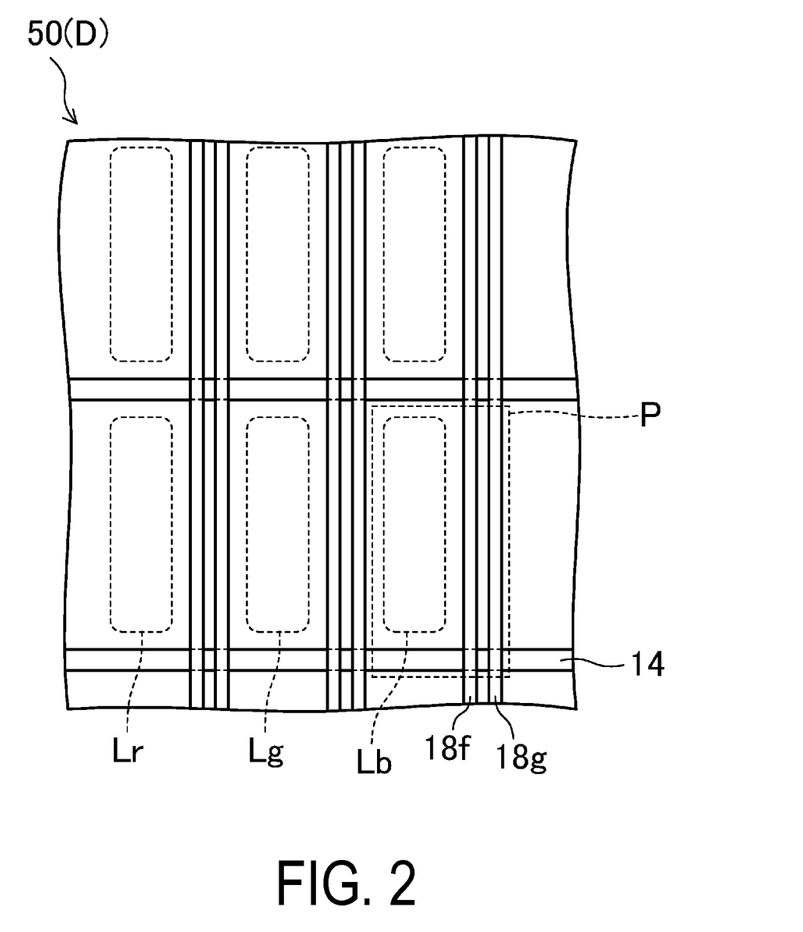
FIG. 2 is a plan view of a display region of the organic EL display device according to the first embodiment of the disclosure.
Figure 3:
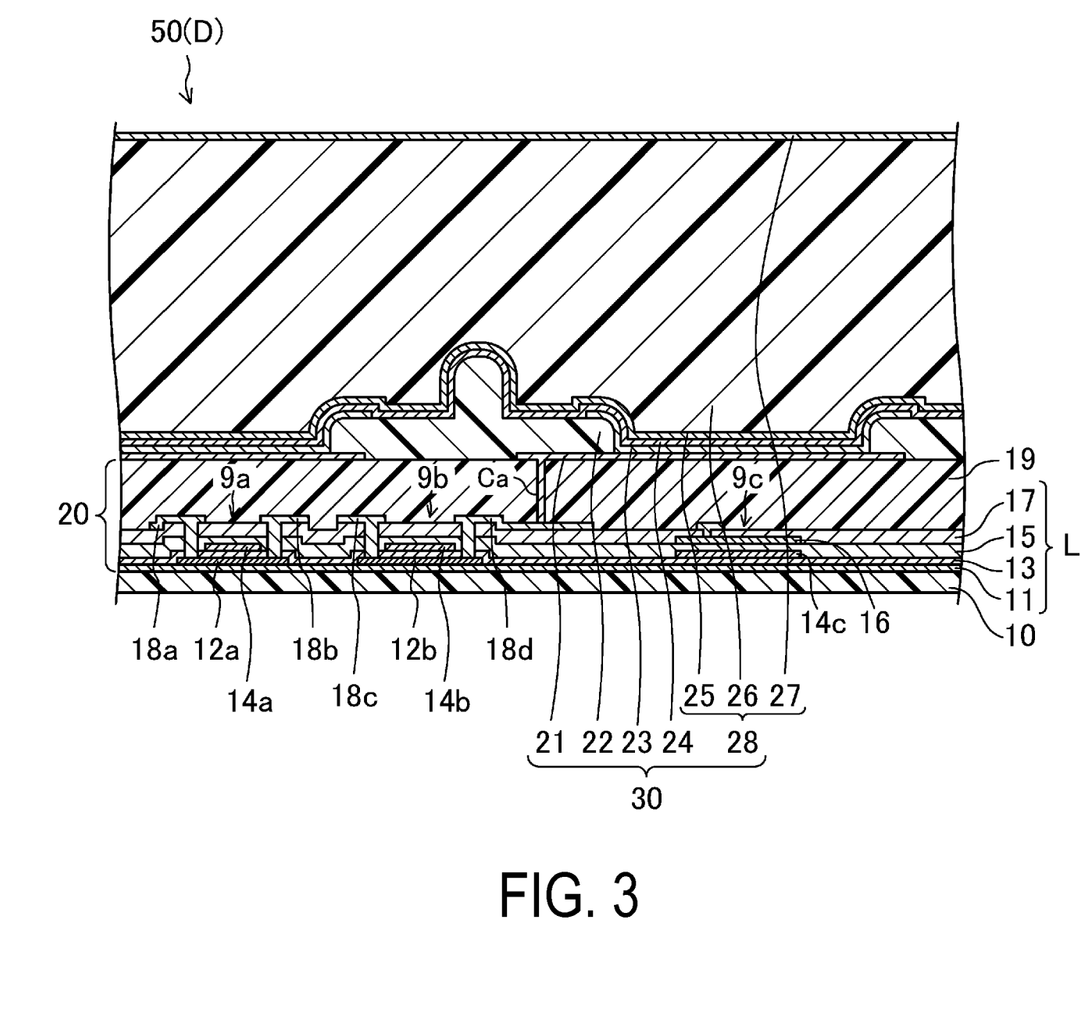
FIG. 3 is a cross-sectional view of a display region of the organic EL display device taken along a line III-III in FIG. 1.
Figure 4:
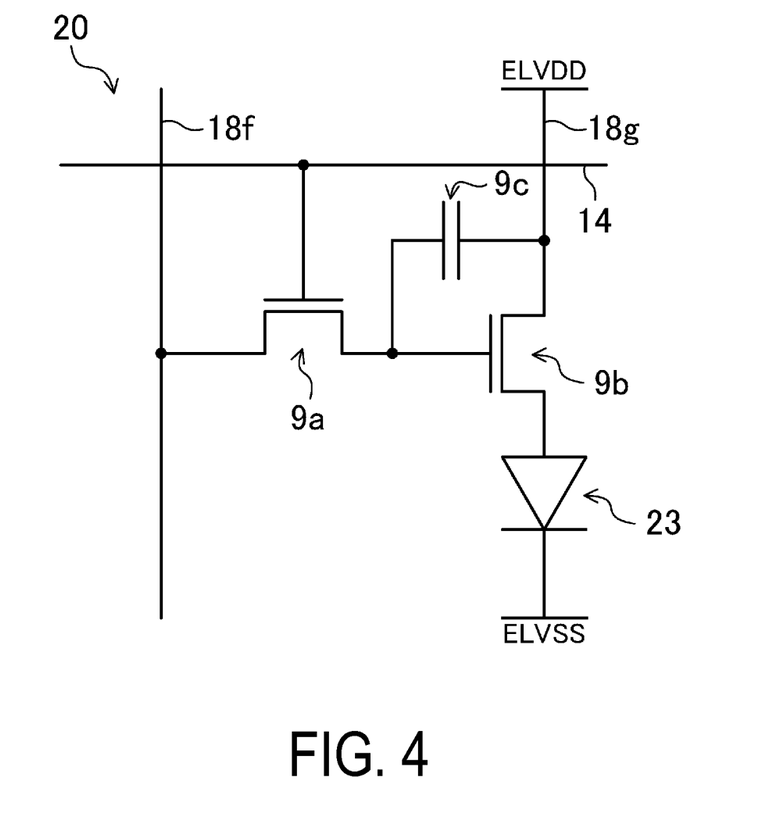
FIG. 4 is an equivalent circuit diagram illustrating a TFT layer constituting the organic EL display device according to the first embodiment of the disclosure.
Figure 5:
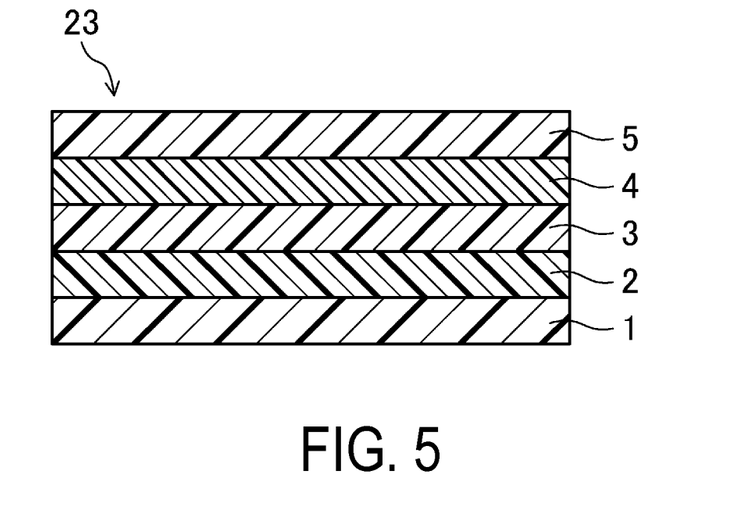
FIG. 5 is a cross-sectional view illustrating an organic EL layer constituting the organic EL display device according to the first embodiment of the disclosure.
Figure 6:
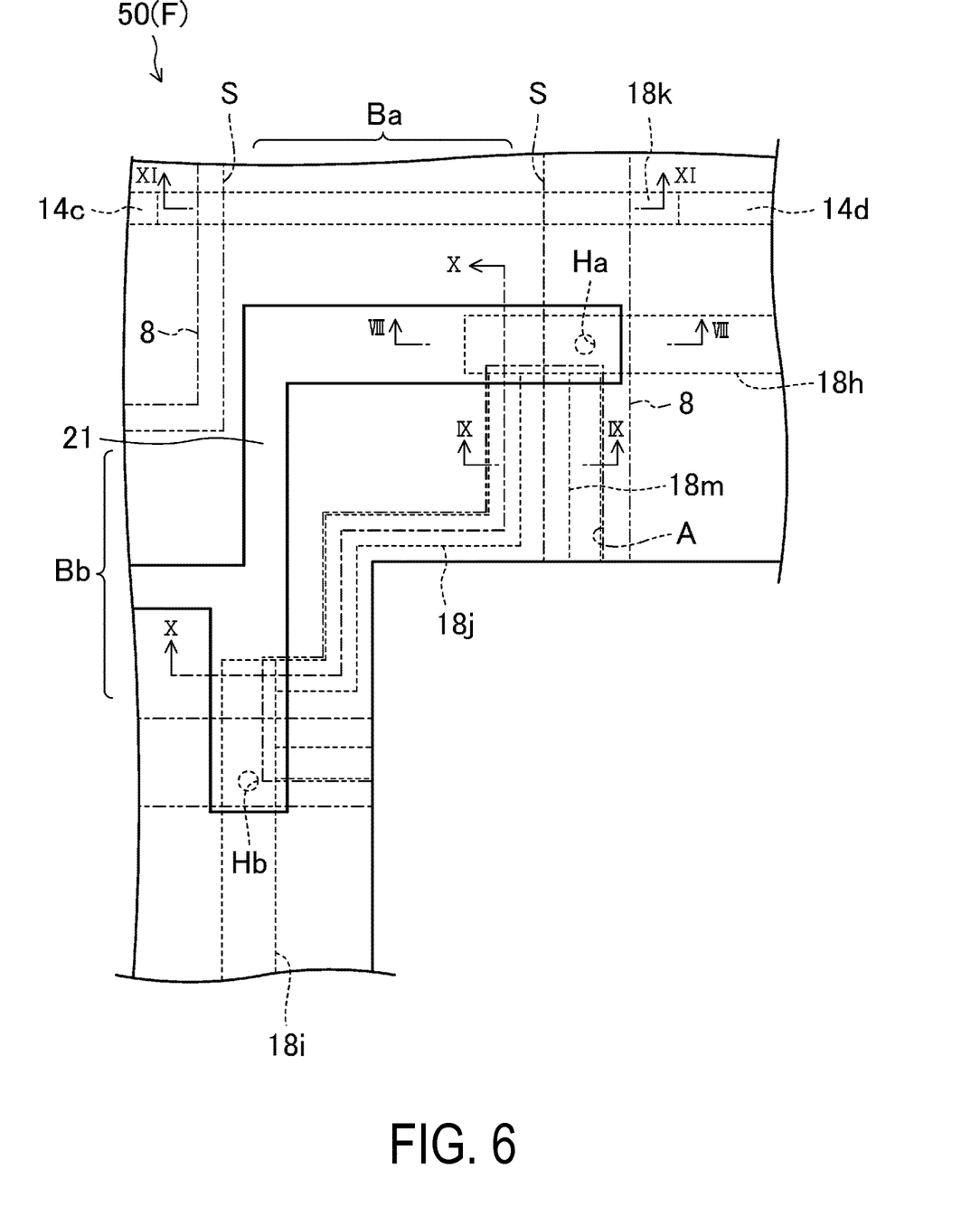
FIG. 6 is a plan view of the organic EL display device, where a region Y in FIG. 1 is enlarged and illustrated.
Figure 7:
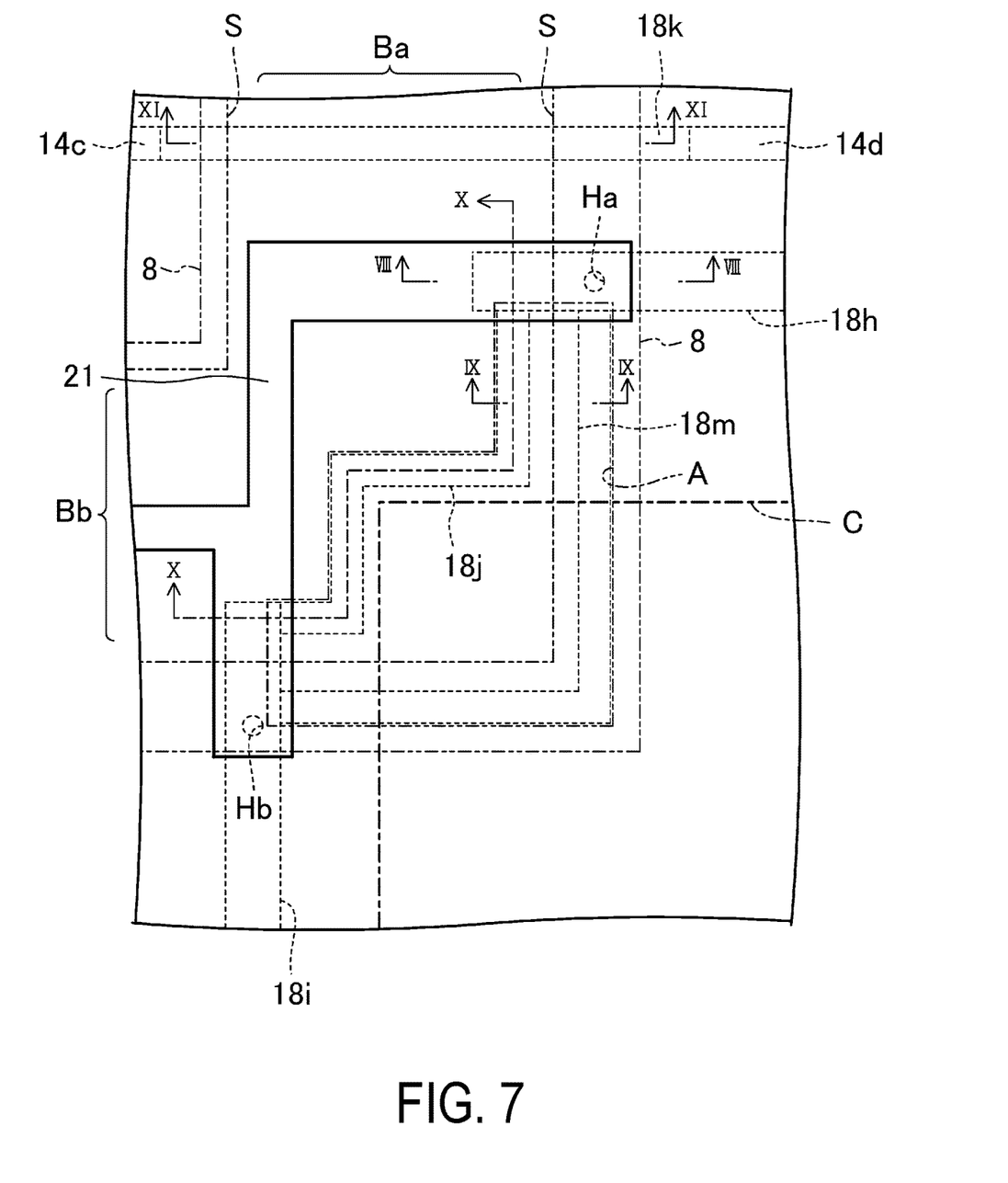
FIG. 7 is a plan view of the organic EL display device before a substrate is partitioned, where the region Y in FIG. 1 is enlarged and illustrated.

FIGS. 1 to 11 illustrate a first embodiment of a display device according to the disclosure. Note that, in each of the following embodiments, an organic EL display device including an organic EL element will be described as a display device including a light-emitting element. FIG. 1 is a plan view illustrating an overall configuration of an organic EL display device 50 according to the present embodiment. FIG. 2 is a plan view of a display region D of the organic EL display device 50. FIG. 3 is a cross-sectional view of the display region D of the organic EL display device 50 taken along a line III-III in FIG. 1. FIG. 4 is an equivalent circuit diagram illustrating a TFT layer 20 constituting the organic EL display device 50. FIG. 5 is a cross-sectional view illustrating an organic EL layer 23 constituting the organic EL display device 50. FIG. 6 is a plan view of the organic EL display device 50, where a region Y in FIG. 1 is enlarged and illustrated. FIG. 7 is a plan view of the organic EL display device 50 before a substrate is partitioned, where the region Y in FIG. 1 is enlarged and illustrated. FIG. 8, FIG. 9, FIG. 10, and FIG. 11 are cross-sectional views of the organic EL display device 50 taken along a line VIII-VIII, line IX-IX, line X-X, and line XI-XI in FIG. 6, respectively.

As illustrated in FIG. 1, the organic EL display device 50 includes the display region D, which is provided and formed in a rectangular shape and displays an image, and a frame region F with four sides provided around the display region D, for example. Although the organic EL display device 50, in which the frame region F with four sides is provided around the rectangular display region D, is exemplified in the present embodiment, the disclosure is applicable to an organic EL display device in which the frame region F with at least three sides is provided around a display region having a polygonal shape.

A plurality of subpixels P are disposed in a matrix shape in the display region D, as illustrated in FIG. 2. In the display region D, a subpixel P including a red light-emitting region Lr configured to display a red color, a subpixel P including a green light-emitting region Lg configured to display a green color, and a subpixel P including a blue light-emitting region Lb configured to display a blue color are provided adjacent to one another, as illustrated in FIG. 2. One pixel is constituted of the three adjacent subpixels P including the red light-emitting region Lr, the green light-emitting region Lg, and the blue light-emitting region Lb respectively, in the display region D.

As illustrated in FIG. 1, a terminal portion T is provided at the right side of the frame region F in the drawing. Moreover, in the frame region F, an upper corner and a lower corner at the right side in FIG. 1 disposed with the terminal portion T interposed therebetween, are each cut out in an L shape in a plan view. At the right side of the frame region F in FIG. 1, between the display region D and the terminal portion T, a bending portion B (a first bending portion Ba; see FIG. 6) bendable at 180 degrees (in a U shape) while taking a longitudinal direction in FIG. 1 as a bending axis, is provided to extend in the longitudinal direction in FIG. 1. At each of the upper side and the lower side of the frame region F in FIG. 1, the bending portion B (a second bending portion Bb; see FIG. 6) bendable at 180 degrees (in a U-shape) while taking a lateral direction in FIG. 1 as a bending axis, is provided to extend in the lateral direction in FIG. 1.

As illustrated in FIG. 3, the organic EL display device 50 includes, in the display region D, a resin substrate layer 10 provided as a resin substrate, a thin film transistor (TFT) layer 20 provided on the resin substrate layer 10, and an organic EL element 30 provided on the TFT layer as a light-emitting element constituting the display region D.

The resin substrate layer 10 is formed of, for example, a polyimide resin.

As illustrated in FIG. 3, the TFT layer 20 includes a base coat film 11 provided on the resin substrate layer 10; a plurality of first TFTs 9a, a plurality of second TFTs 9b, and a plurality of capacitors 9c, which are provided on the base coat film 11; and a second flattening film 19 provided on each of the first TFTs 9a, each of the second TFTs 9b, and each of the capacitors 9c. A first flattening film 8 is provided in the frame region F, as described later. Here, in the TFT layer 20, as illustrated in FIGS. 2 and 4, a plurality of gate lines 14 are provided in such a manner as to extend parallel to each other in the lateral direction in the drawings. In the TFT layer 20, as illustrated in FIGS. 2 and 4, a plurality of source lines 18f are provided in such a manner as to extend parallel to each other in the longitudinal direction in the drawings. In the TFT layer 20, as illustrated in FIGS. 2 and 4, a plurality of power source lines 18g are provided in such a manner as to extend parallel to each other in the longitudinal direction in the drawings while being arranged adjacent to the corresponding source lines 18f. In the TFT layer 20, as illustrated in FIG. 4, each subpixel P includes the first TFT 9a, the second TFT 9b, and the capacitor 9c.

The base coat film 11 is constituted of a single-layer film or a layered film of an inorganic insulating film of, for example, silicon nitride, silicon oxide, silicon oxide nitride, or the like.

The first TFT 9a is connected to the corresponding gate line 14 and source line 18f in each subpixel P, as illustrated in FIG. 4. In addition, as illustrated in FIG. 3, the first TFT 9a includes a semiconductor layer 12a, a gate insulating film 13, a gate electrode 14a, a first interlayer insulating film 15, a second interlayer insulating film 17, and a source electrode 18a and a drain electrode 18b, which are provided in sequence on the base coat film 11. As illustrated in FIG. 3, the semiconductor layer 12a is provided and formed in an island shape on the base coat film 11, and includes a channel region, a source region, and a drain region. As illustrated in FIG. 3, the gate insulating film 13 is provided to cover the semiconductor layer 12a. As illustrated in FIG. 3, the gate electrode 14a is provided on the gate insulating film 13 which overlaps with the channel region of the semiconductor layer 12a. Further, as illustrated in FIG. 3, the first interlayer insulating film 15 and the second interlayer insulating film 17 are sequentially provided to cover the gate electrode 14a. As illustrated in FIG. 3, the source electrode 18a and the drain electrode 18b are provided to be separate from each other on the second interlayer insulating film 17. Furthermore, as illustrated in FIG. 3, the source electrode 18a and the drain electrode 18b are connected to the source region and the drain region of the semiconductor layer 12a, respectively, via respective contact holes formed in the layered film of the gate insulating film 13, the first interlayer insulating film 15, and the second interlayer insulating film 17. The gate insulating film 13, the first interlayer insulating film 15 and the second interlayer insulating film 17 are constituted of a single-layer film or a layered film of an inorganic insulating film of, for example, silicon nitride, silicon oxide, silicon oxynitride, or the like.

The second TFT 9b is connected to the corresponding first TFT 9a and power source line 18g in each subpixel P, as illustrated in FIG. 4. In addition, as illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are provided in sequence on the base coat film 11. As illustrated in FIG. 3, the semiconductor layer 12b is provided and formed in an island shape on the base coat film 11, and includes a channel region, a source region, and a drain region. As illustrated in FIG. 3, the gate insulating film 13 is provided to cover the semiconductor layer 12b. As illustrated in FIG. 3, the gate electrode 14b is provided on the gate insulating film 13 which overlaps with the channel region of the semiconductor layer 12b. Further, as illustrated in FIG. 3, the first interlayer insulating film 15 and the second interlayer insulating film 17 are sequentially provided to cover the gate electrode 14b. As illustrated in FIG. 3, the source electrode 18c and the drain electrode 18d are provided to be separate from each other on the second interlayer insulating film 17. Furthermore, as illustrated in FIG. 3, the source electrode 18c and the drain electrode 18d are connected to the source region and the drain region of the semiconductor layer 12b, respectively, via respective contact holes formed in the layered film of the gate insulating film 13, the first interlayer insulating film 15, and the second interlayer insulating film 17.

In this embodiment, the first TFT 9a and the second TFT 9b are described as being of a top-gate type; however, the first TFT 9a and the second TFT 9b may be a bottom-gate type TFT.

The capacitor 9c is connected to the corresponding first TFT 9a and power source line 18g in each subpixel P, as illustrated in FIG. 4. The capacitor 9c includes, as illustrated in FIG. 3, a lower conductive layer 14c formed with the same material in the same layer as the gate electrodes 14a and 14b, the first interlayer insulating film 15 provided to cover the lower conductive layer 14c, and an upper conductive layer 16 provided on the first interlayer insulating film 15 in such a manner as to overlap with the lower conductive layer 14c.

The second flattening film 19 is formed of, for example, an organic resin material such as a polyimide resin.

The organic EL element 30 includes, as illustrated in FIG. 3, a plurality of first electrodes 21, an edge cover 22, a plurality of an organic EL layer 23, a second electrode 24, and a sealing film 28, which are provided sequentially on the second flattening film 19.

As illustrated in FIG. 3, the plurality of first electrodes 21 are provided in a matrix shape as pixel electrodes over the second flattening film 19 in such a manner as to correspond to the plurality of subpixels P. As illustrated in FIG. 3, the first electrode 21 is connected to the drain electrode 18d of each second TFT 9b via a contact hole formed in the second flattening film 19. The first electrode 21 functions to inject holes (positive holes) into the organic EL layer 23. The first electrode 21 is preferably formed of a material having a large work function to improve the efficiency of hole injection into the organic EL layer 23. As materials for constituting the first electrode 21, metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn) may be cited, for example. The material constituting the first electrode 21 may be, for example, an alloy of astatine (At)/astatine oxide (AtO$_2$). For materials constituting the first electrode 21, there may be adopted electrically conductive oxides, as examples, such as tin oxide (SnO), zinc oxide (ZnO), indium tin oxide (ITO), and indium zinc oxide (IZO). The first electrode 21 may be formed by layering a plurality of layers formed of any of the materials described above. Examples of compound materials having a large work function include indium tin oxide (ITO) and indium zinc oxide (IZO).

As illustrated in FIG. 3, the edge cover 22 is provided in a lattice pattern in such a manner as to cover a peripheral portion of each first electrode 21. For materials constituting the edge cover 22, there are cited organic films of, for example, polyimide resin, acrylic resin, polysiloxane resin, and novolac resin.

As illustrated in FIG. 3, the plurality of organic EL layers 23 are disposed on each of the first electrodes 21 and are provided in a matrix shape to correspond to the plurality of subpixels. As illustrated in FIG. 5, each organic EL layer 23 includes a hole injection layer 1, a hole transport layer 2, a light-emitting layer 3, an electron transport layer 4, and an electron injection layer 5, which are provided sequentially in that order over the first electrode 21.

The hole injection layer 1 is also referred to as an anode electrode buffer layer, and functions to reduce an energy level difference between the first electrode 21 and the organic EL layer 23 to thereby improve the efficiency of hole injection into the organic EL layer 23 from the first electrode 21. Examples of materials that may constitute the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 21 to the organic EL layer 23. Here, examples of materials that may constitute the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24, respectively, and the holes and the electrons recombine, when a voltage is applied via the first electrode 21 and the second electrode 24. The light-emitting layer 3 is formed of a material having high light-emitting efficiency. Examples of materials that may constitute the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 30 by this function. Note that the electron injection layer 5 is also referred to as a cathode buffer layer. Examples of materials constituting the electron injection layer 5 include inorganic alkali compounds such as lithium fluoride (LiF), magnesium fluoride ($MgF_2$), calcium fluoride ($CaF_2$), strontium fluoride ($SrF_2$) and barium fluoride ($BaF_2$), aluminum oxide ($Al_2O_3$), and strontium oxide (SrO).

As illustrated in FIG. 3, the second electrode 24 is provided as a common electrode and covers each organic EL layer 23 and the edge cover 22. The second electrode 24 functions to inject electrons into the organic EL layer 23. The second electrode 24 is preferably formed of a material having a small work function to improve the efficiency of electron injection into the organic EL layer 23. Materials constituting the second electrode 24 include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of an alloy of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (AI), for example.

The second electrode 24 may be formed of an electrically conductive oxide such as tin oxide (SnO), zinc oxide (ZnO), indium tin oxide (ITO), and indium zinc oxide (IZO). The second electrode 24 may be formed by layering a plurality of layers of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (AI).

The sealing film 28 includes, as illustrated in FIG. 3, a first inorganic film 25 provided in such a manner as to cover the second electrode 24, an organic film 26 provided on the first inorganic film 25, and a second inorganic film 27 provided in such a manner as to cover the organic film 26, and functions to protect the organic EL layer 23 from water, oxygen, and the like. The first inorganic film 25 and the second inorganic film 27 are constituted of an inorganic material, such as silicon oxide ($SiO_2$), aluminum oxide ($Al_2O_3$), silicon nitride (SiNx (x is a positive number)) like trisilicon tetranitride ($Si_3N_4$), or silicon carbonitride (SiCN), for example. The organic film 26 is constituted of an organic material such as, for example, acrylate, polyurea, parylene, polyimide, or polyamide.

As illustrated in FIGS. 6 and 8 to 11, the organic EL display device 50 includes the resin substrate layer 10, an inorganic insulating layered film L provided on the resin substrate layer 10, the first flattening film 8, the second flattening film 19, a first wiring line 18h, a second wiring line 18i, a third wiring line 18j, a fourth wiring line 21a, and a fifth wiring line 18k in the frame region F.

Figure 8:
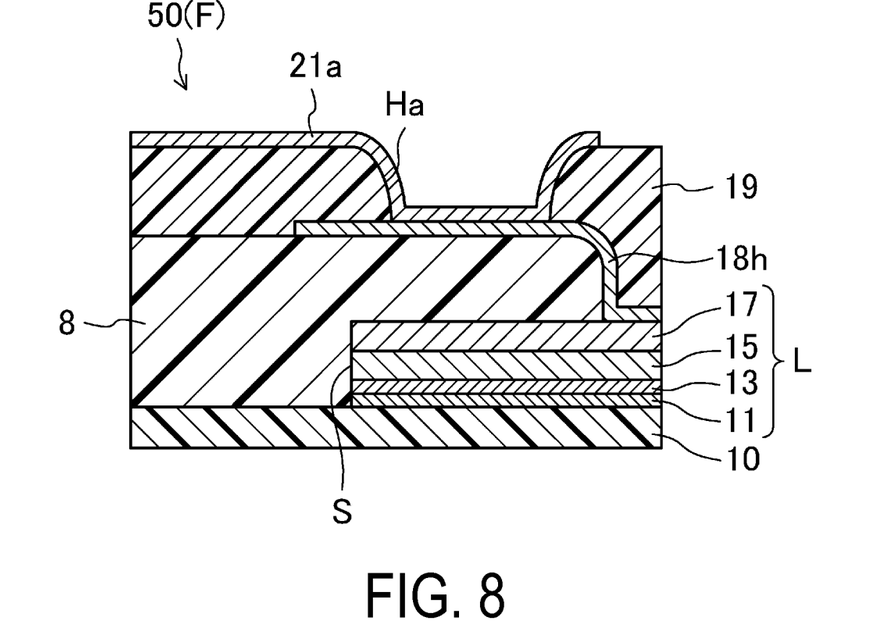
FIG. 8 is a cross-sectional view of the organic EL display device taken along a line VIII-VIII in FIG. 6.
Figure 9:
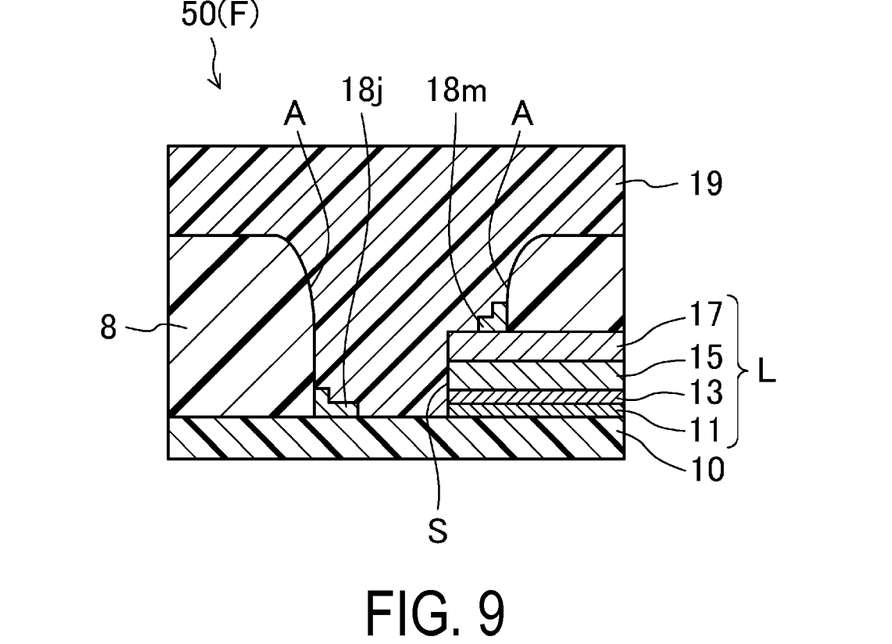
FIG. 9 is a cross-sectional view of the organic EL display device taken along a line IX-IX in FIG. 6.
Figure 10:
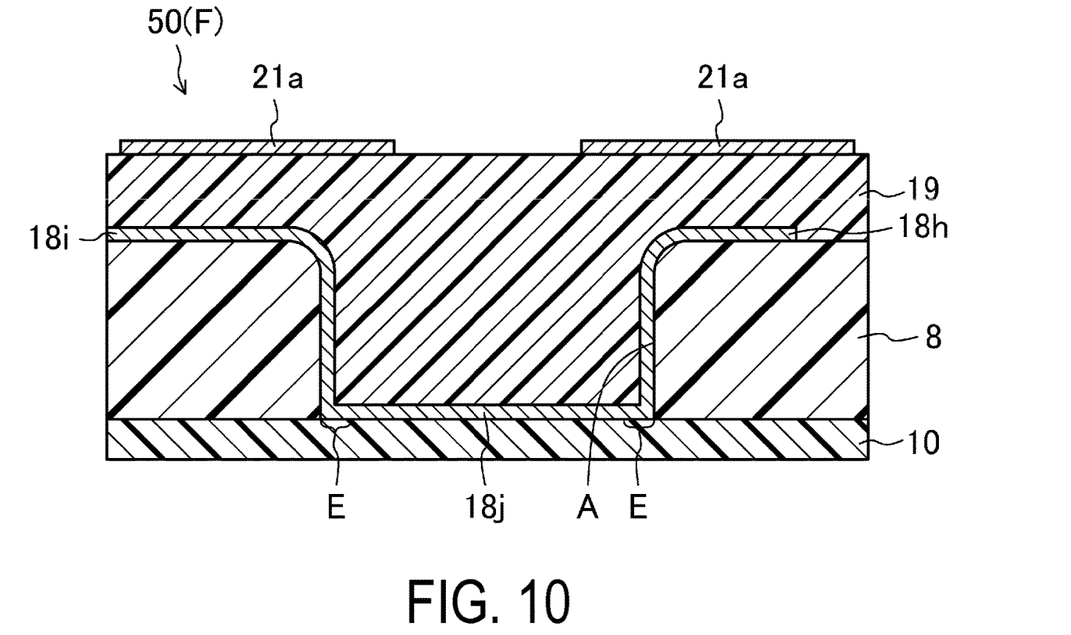
FIG. 10 is a cross-sectional view of the organic EL display device taken along a line X-X in FIG. 6.

The inorganic insulating layered film L is at least one layer of an inorganic insulating film constituting the TFT layer 20, and includes, as illustrated in FIGS. 8 to 10, the base coat film 11, the gate insulating film 13, the first interlayer insulating film 15, and the second interlayer insulating film 17, which are layered in that order on the resin substrate layer 10. As illustrated in FIGS. 6, 8, 9, and 11, in the bending portion B (the first bending portion Ba and second bending portion Bb), a slit S, which passes through the inorganic insulating layered film L to expose the upper face of the resin substrate layer 10, is formed in the inorganic insulating layered film L. The slit S is provided and formed in a passing-through groove shape along directions in which the first bending portion Ba and the second bending portion Bb extend.

As illustrated in FIGS. 8 and 10, the first wiring line 18h is provided on the first flattening film 8 at one side of the frame region F (the right side in FIG. 1). Further, as illustrated in FIGS. 6 and 10, the first wiring line 18h includes an extending portion E extended to the upper face of the resin substrate layer 10, which is exposed from the slit S of the inorganic insulating layered film L and is also exposed from an opening A of the first flattening film 8 to be explained later. The first wiring line 18h and the second wiring line 18i are formed with the same material in the same layer as the source electrodes 18a and 18c.

As illustrated in FIG. 10, the second wiring line 18i is provided on the first flattening film 8 at one side of the frame region F (the upper side and lower side in FIG. 1). Further, as illustrated in FIGS. 6 and 10, the second wiring line 18i includes an extending portion E extended to the upper face of the resin substrate layer 10, which is exposed from the slit S of the inorganic insulating layered film L and is also exposed from the opening A of the first flattening film 8 to be explained later.

Figure 11:
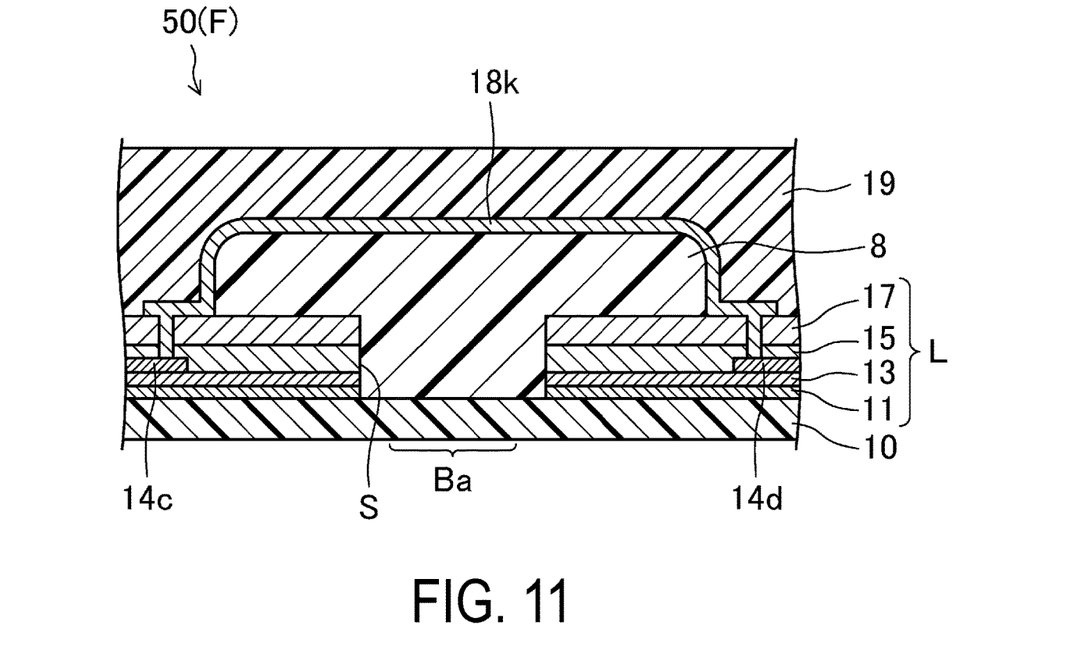
FIG. 11 is a cross-sectional view of the organic EL display device taken along a line XI-XI in FIG. 6.

As illustrated in FIGS. 6 and 11, the first flattening film 8 is provided inside of and on an edge portion of the slit S formed in the inorganic insulating layered film L. The first flattening film 8 is provided, inside of the slit S of the inorganic insulating layered film L, which exposes the upper face of the resin substrate layer 10 between the extending portions E where the first wiring line 18h and the second wiring line 18i are extend. That is, in the first flattening film 8, as illustrated in FIG. 7, there is provided the opening A, which exposes the upper face of the resin substrate layer 10 between the extending portion E of the first wiring line 18h and the extending portion E of the second wiring line 18i in a state of before partitioning the substrate. A dot-dash line C in FIG. 7 is a cutting line of the substrate. In addition, as illustrated in FIGS. 6 and 9, the first flattening film 8 is provided which exposes the upper face of an end portion of the inorganic insulating layered film L where the slit S is formed, on the opposite side of the first bending portion Ba and the second bending portion Bb to the display region D.

As illustrated in FIGS. 6 and 9, the third wiring line 18j is provided between an end face of the first flattening film 8 and the upper face of the resin substrate layer 10, and is formed with the same material in the same layer as the first wiring line 18h and the second wiring line 18i. The first wiring line 18h and the second wiring line 18i are electrically connected to each other with the third wiring line 18j, as illustrated in FIGS. 6 and 10. Since a perimeter edge surface of the opening A of the first flattening film 8 (for example, approximately 2 μm in thickness) is slanted at a relatively high angle (for example, approximately 50 degrees) with respect to the upper face of the resin substrate layer 10, a conductive film to serve as the source electrodes 18a and 18c is film-formed to cover the first flattening film 8, and a resist application film applied onto the conductive film is thickened at a circumferential end portion of the opening A of the first flattening film 8. As a result, a resist pattern obtained by exposing and developing the resist application film remains at the circumferential end portion of the opening A of the first flattening film 8, so that the third wiring line 18j is formed by the conductive film under the remaining resist pattern. Furthermore, since the perimeter edge surface of the opening A of the first flattening film 8 is similarly slanted at a relatively high angle with respect to the upper face of the inorganic insulating layered film L on the resin substrate layer 10, a conductive film 18m is formed between an end face of the first flattening film 8 and the upper face of the inorganic insulating layered film L, as illustrated in FIGS. 6 and 9.

As illustrated in FIGS. 6 and 8, one end portion of the fourth wiring line 21a is electrically connected to the first wiring line 18h via a contact hole Ha formed in the second flattening film 19. Further, as illustrated in FIG. 6, the other end portion of the fourth wiring line 21a is electrically connected to the second wiring line 18i via a contact hole Hb formed in the second flattening film 19. The fourth wiring line 21a is formed with the same material in the same layer as the first electrode 21. The first wiring line 18h and the second wiring line 18i are electrically connected to each other with the fourth wiring line 21a as well. Further, the first wiring line 18h, the second wiring line 18i, the third wiring line 18j, and the fourth wiring line 21a are electrically connected to the high-level power source line 18g (ELDVV).

As illustrated in FIG. 6, a plurality of the fifth wiring lines 18k are provided at one side of the frame region F (the right side in FIG. 1) on the first flattening film 8 and on the inorganic insulating layered film L exposed from the first flattening film 8 in such a manner as to extend parallel to each other in a direction intersecting with the direction in which the first bending portion Ba extends. As illustrated in FIG. 11, end portions of the fifth wiring line 18k are electrically connected to a first gate conductive layer (the lower conductive layer) 14c and a second gate conductive layer 14d, respectively, via contact holes formed in the layered film of the first interlayer insulating film 15 and the second interlayer insulating film 17. The fifth wiring line 18k is formed with the same material in the same layer as the source electrodes 18a and 18c. As illustrated in FIG. 11, the first gate conductive layer 14c is provided between the gate insulating film 13 and the first interlayer insulating film 15, and is electrically connected to the signal wiring lines of the TFT layer 20 (the gate line 14, the source line 18f, the power source line 18g, and the like) in the display region D. As illustrated in FIG. 6, the second gate conductive layer 14d is provided between the gate insulating film 13 and the first interlayer insulating film 15, and extends to the terminal portion T. The first gate conductive layer 14c and second gate conductive layer 14d are formed with the same material in the same layer as the gate electrodes 14a and 14b.

As illustrated in FIGS. 8 to 11, the second flattening film 19 is provided which covers the first wiring line 18h, the second wiring line 18i, the third wiring line 18j, and the fifth wiring line 18k.

In the organic EL display device 50 described heretofore, in each subpixel P, a gate signal is inputted into the first TFT 9a via the gate line 14 to thereby turn on the first TFT 9a, a predetermined voltage corresponding to a source signal is written in the gate electrode 14b of the second TFT 9b and the capacitor 9c via the source line 18f, and a current from the power source line 18g defined based on the gate voltage of the second TFT 9b is supplied to the organic EL layer 23, whereby the light-emitting layer 3 of the organic EL layer 23 emits light to display an image. In the organic EL display device 50, since even when the first TFT 9a is turned off, the gate voltage of the second TFT 9b is held by the capacitor 9c, the light-emitting layer 3 is kept emitting light until a gate signal of the next frame is inputted.

The organic EL display device 50 of the present embodiment may be manufactured by, for example, forming the TFT layer 20a and the organic EL element 30, by use of a known method, on the resin substrate layer 10 formed on a glass substrate, then peeling off the glass substrate by radiation of laser beams, and cutting off two corners of the resin substrate layer 10.

As described above, according to the organic EL display device 50 of the present embodiment, the first wiring line 18h and the second wiring line 18i are electrically connected to each other via the third wiring line 18j provided between the perimeter edge surface of the opening A of the first flattening film 8 and the upper face of the resin substrate layer 10. The third wiring line 18j is formed with the same material in the same layer as the first wiring line 18h and the second wiring line 18i, and is automatically formed by making use of the slanted shape of the perimeter edge surface of the opening A of the first flattening film 8; because of this, it is unnecessary to reflect the planar shape of the third wiring line 18j in a photomask used when forming the first wiring line 18h and the second wiring line 18i. As a result, the third wiring line 18j may be easily formed, so that the first wiring line 18h provided in the first bending portion Ba and the second wiring line 18i provided in the second bending portion Bb may be electrically connected with ease.

According to the organic EL display device 50 of the present embodiment, since the first wiring line 18h and the second wiring line 18*i* are electrically connected via the fourth wiring line 21*a* provided on the second flattening film 19, even when the third wiring line 18*j* is disconnected, the electrical connection between the first wiring line 18*h* and the second wiring line 18*i* can be secured by the fourth wiring line 21*a*.

Other Embodiments

In the embodiment described above, the organic EL display device including the bending portions bendable at three sides of the frame region is exemplified. However, the disclosure may also be applied to an organic EL display device including bending portions bendable at two adjacent sides or four sides of a frame region.

In the embodiments described above, the organic EL layer of a five-layer structure including the hole injection layer, the hole transport layer, the light-emitting layer, the electron transport layer, and the electron injection layer is exemplified. However, the organic EL layer may have, for example, a three-layer structure including a hole injection-cum-transport layer, a light-emitting layer, and an electron transport-cum-injection layer.

In the embodiments described above, the example of the organic EL display devices including the first electrode as an anode and the second electrode as a cathode is given. However, the disclosure is also applicable to an organic EL display device, in which the layers of the structure of the organic EL layer are in the reverse order, with the first electrode being a cathode and the second electrode being an anode.

In the embodiments described above, the example of the organic EL display devices including the element substrate, in which the electrode of the TFT connected to the first electrode is the drain electrode, is given. However, the disclosure is also applicable to an organic EL display device including an element substrate, in which the electrode of the TFT connected to the first electrode is referred to as the source electrode.

Although the foregoing embodiments describe organic EL display devices as examples of display devices, the disclosure may be applied in display devices including a plurality of light-emitting elements that are driven by an electrical current. For example, the disclosure is applicable to a display device including a quantum-dot light emitting diode (QLED), which is a light-emitting element using a quantum dot-containing layer.

INDUSTRIAL APPLICABILITY

As described above, the disclosure is useful for a flexible display device.

The invention claimed is:

1. A display device comprising:
a resin substrate;
a thin film transistor (TFT) layer provided on the resin substrate;
a light-emitting element provided on the TFT layer and constituting a display region;
a frame region with at least three sides provided around the display region;
a terminal portion provided at an end portion of one side of the frame region with at least three sides;
a first bending portion provided to extend in one direction between the display region and the terminal portion;
a second bending portion provided to extend in one direction at another side of the frame region adjacent to the one side of the frame region including the first bending portion;
at least one layer of an inorganic insulating film provided in the frame region with at least three sides and constituting the TFT layer layered on the resin substrate;
a first flattening film provided on the at least one layer of the inorganic insulating film;
a first wiring line provided on the first flattening film at the one side of the frame region;
a second wiring line provided on the first flattening film at the other side of the frame region; and
a second flattening film provided to cover the first wiring line and the second wiring line,
wherein in the first bending portion and the second bending portion, a slit is formed in the at least one layer of the inorganic insulating film, where the slit passes through the at least one layer of the inorganic insulating film to expose an upper face of the resin substrate,
the first wiring line and the second wiring line are extended to the upper face of the resin substrate exposed from the slit,
the first flattening film is provided at an interior of the slit,
the first flattening film is provided at the interior of the slit which exposes the upper face of the resin substrate between portions to which the first wiring line and the second wiring line are extended, and
the first wiring line and the second wiring line are electrically connected to each other via a third wiring line that is provided between an end face of the first flattening film and the upper face of the resin substrate, and is formed with a material identical to the material of the first wiring line and the second wiring line in a layer identical to the layer of the first wiring line and the second wiring line.

2. The display device according to claim 1,
wherein the first wiring line and the second wiring line are electrically connected to each other via a fourth wiring line provided on the second flattening film.

3. The display device according to claim 2,
wherein the light-emitting element includes a pixel electrode, and the fourth wiring line is formed with a material identical to the material of the pixel electrode in a layer identical to the layer of the pixel electrode.

4. The display device according to claim 2,
wherein the first wiring line and the second wiring line are electrically connected to the fourth wiring line via a contact hole formed in the second flattening film.

5. The display device according to claim 1,
wherein the TFT layer includes a source electrode, and the first wiring line, the second wiring line, and the third wiring line are formed with a material identical to the material of the source electrode in a layer identical to the layer of the source electrode.

6. The display device according to claim 1,
wherein the first flattening film and the second flattening film are an organic insulating film.

7. The display device according to claim 1,
wherein the first flattening film is provided to expose an upper face of an end portion of the at least one layer of the inorganic insulating film on an opposite side of the first bending portion and the second bending portion to the display region, and
a conductive film formed with a material identical to the material of the first and second wiring lines in a layer identical to the layer of the first and second wiring lines remains between the end face of the first flattening film and the upper face of the at least one layer of the inorganic insulating film.

8. The display device according to claim 1,
wherein the third wiring line is provided in such a manner as not to overlap with the at least one layer of the inorganic insulating film.

9. The display device according to claim 1,
wherein at one side of the frame region, on the first flattening film and on the at least one layer of the inorganic insulating film exposed from the first flattening film, a plurality of fifth wiring lines are provided to extend parallel to each other in a direction intersecting with the direction in which the first bending portion extends, and
each fifth wiring line is formed with a material identical to the material of the first and second wiring lines in a layer identical to the layer of the first and second wiring lines.

10. The display device according to claim 1,
wherein the slit is provided and formed in a passing-through groove shape along the directions in which the first bending portion and the second bending portion extend.

11. The display device according to claim 1,
wherein in a portion where one side of the frame region and another one side of the frame region intersect with each other, part of the resin substrate is cut out.

12. The display device according to claim 1,
wherein the first wiring line, the second wiring line, and the third wiring line are electrically connected to a high-level power source line.

13. The display device according to claim 1,
wherein the light-emitting element is an organic electroluminescence (EL) element.

* * * * *